US010310285B2

(12) United States Patent
Fan (10) Patent No.: US 10,310,285 B2
(45) Date of Patent: Jun. 4, 2019

(54) WAFER-LEVEL LIQUID-CRYSTAL-ON-SILICON PROJECTION ASSEMBLY, SYSTEMS AND METHODS (71) Applicant: OmniVision Technologies, Inc., Santa Clara, CA (US)

(72) Inventor: Chun-Sheng Fan, HsinChu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 7 days.

(21) Appl. No.: 15/817,064

(22) Filed: Nov. 17, 2017

(65) Prior Publication Data
US 2018/0095290 A1 Apr. 5, 2018

Related U.S. Application Data (62) Division of application No. 14/278,452, filed on May 15, 2014, now Pat. No. 9,851,575.

(51) Int. Cl.
*G02B 27/26* (2006.01)
*G02B 13/00* (2006.01)
(Continued)

(52) U.S. Cl.
CPC ......... *G02B 27/26* (2013.01); *G02B 13/0085* (2013.01); *G02B 13/16* (2013.01);
(Continued)

(58) Field of Classification Search
CPC .... G02B 27/26; G02B 13/0085; G02B 13/16; G02B 27/0172; G02B 2027/0178;
(Continued)

(56) References Cited

U.S. PATENT DOCUMENTS 2,832,114 A 4/1958 Mead
3,266,111 A 8/1966 Abel
(Continued)

FOREIGN PATENT DOCUMENTS

CN 101014896 A 8/2007
CN 101490606 A 7/2009
(Continued)

OTHER PUBLICATIONS

Machine Translation of JP 2003255360 A.*
(Continued)

*Primary Examiner* — Steven Whitesell Gordon
*Assistant Examiner* — Jerry L Brooks
(74) *Attorney, Agent, or Firm* — Lathrop Gage LLP (57) ABSTRACT A wafer-level liquid-crystal-on-silicon (LCOS) projection assembly includes a LCOS display for spatially modulating light incident on the LCOS display and a polarizing beam-separating (PBS) layer for directing light to and from the LCOS display. A method for fabricating a LCOS projection system includes disposing a PBS wafer above an active-matrix wafer. The active-matrix wafer includes a plurality of active matrices for addressing liquid crystal display pixels. The method, further includes disposing a lens wafer above the PBS wafer. The lens wafer includes a plurality of lenses. Additionally, a method for fabricating a wafer-level polarizing beam includes bonding a PBS wafer and at least one other wafer to form a stacked wafer. The PBS wafer includes a PBS layer that contains a plurality of PBS film bands.

8 Claims, 8 Drawing Sheets (51) Int. Cl.
| | | |
|---|---|---|
| G02B 27/01 | (2006.01) | |
| G03B 21/00 | (2006.01) | |
| G03B 21/20 | (2006.01) | |
| H01L 25/00 | (2006.01) | |
| H01L 25/16 | (2006.01) | |
| G02B 13/16 | (2006.01) | |

(52) U.S. Cl.
CPC ....... *G02B 27/0172* (2013.01); *G03B 21/006* (2013.01); *G03B 21/2066* (2013.01); *G03B 21/2073* (2013.01); *H01L 25/167* (2013.01); *H01L 25/50* (2013.01); *G02B 2027/0178* (2013.01); *H01L 2924/0002* (2013.01)

(58) Field of Classification Search
CPC . G03B 21/006; G03B 21/2073; H01L 25/167; H01L 25/50; H01L 2924/002
USPC ........................................................ 353/20
See application file for complete search history.

(56) References Cited

U.S. PATENT DOCUMENTS

| | | | |
|---|---|---|---|
| 3,600,069 | A | 8/1971 | McNeill |
| 3,878,330 | A | 4/1975 | Novak |
| 5,159,639 | A | 10/1992 | Shannon et al. |
| 5,208,616 | A | 5/1993 | Chang |
| 5,475,213 | A * | 12/1995 | Fujii .............. G02F 1/1354 250/214 LA |
| 5,487,522 | A | 1/1996 | Hook |
| 5,664,293 | A | 9/1997 | Bartoo |
| 5,751,476 | A | 5/1998 | Matsui |
| 5,764,412 | A * | 6/1998 | Suzuki ............. G02B 27/283 349/5 |
| 5,886,822 | A | 3/1999 | Spitzer |
| 6,023,372 | A | 2/2000 | Spitzer et al. |
| 6,542,298 | B1 | 4/2003 | Aoki |
| 6,659,777 | B1 | 12/2003 | Rondeau |
| 6,747,611 | B1 | 6/2004 | Budd et al. |
| 6,992,718 | B1 | 1/2006 | Takahara |
| 7,419,260 | B1 | 9/2008 | Nang |
| 7,631,968 | B1 | 12/2009 | Dobson et al. |
| 7,675,684 | B1 | 3/2010 | Neissman et al. |
| 7,735,996 | B2 | 6/2010 | Van Der Zwan et al. |
| D624,111 | S | 9/2010 | Knoop |
| 8,159,751 | B2 | 4/2012 | Martins |
| D659,741 | S | 5/2012 | Heinrich et al. |
| D660,990 | S | 5/2012 | Le et al. |
| D664,185 | S | 7/2012 | Heinrich et al. |
| 8,373,690 | B2 | 2/2013 | Kurozuka |
| 8,388,138 | B1 | 3/2013 | Boothroyd |
| 8,508,851 | B2 | 8/2013 | Miao et al. |
| 2003/0122999 | A1* | 7/2003 | Chae ................ G02F 1/133526 349/110 |
| 2004/0169663 | A1 | 9/2004 | Bernier |
| 2005/0042792 | A1* | 2/2005 | Patel ................ B81C 1/00333 438/57 |
| 2006/0055866 | A1 | 3/2006 | Dietz |
| 2007/0058110 | A1* | 3/2007 | Kajita ............... G02F 1/133533 349/96 |
| 2007/0211339 | A1 | 9/2007 | Furusato |
| 2007/0251062 | A1 | 11/2007 | Saitoh et al. |
| 2008/0013051 | A1 | 1/2008 | Glinski et al. |
| 2008/0278812 | A1 | 11/2008 | Amitai |
| 2008/0284720 | A1 | 11/2008 | Fukutome |
| 2009/0007388 | A1 | 1/2009 | Villeneuve |
| 2009/0128781 | A1* | 5/2009 | Li .................... G02B 6/0008 353/20 |
| 2009/0190043 | A1* | 7/2009 | Pei .................. H04N 9/3108 348/744 |
| 2009/0278766 | A1 | 11/2009 | Sako et al. |
| 2011/0051093 | A1* | 3/2011 | Qu .................. G02B 27/285 353/20 |
| 2012/0032205 | A1 | 2/2012 | O'Connor et al. |
| 2012/0038549 | A1 | 2/2012 | Mandella et al. |
| 2012/0081658 | A1 | 4/2012 | Sugihara et al. |
| 2013/0016292 | A1 | 1/2013 | Miao et al. |
| 2013/0021658 | A1 | 1/2013 | Miao et al. |
| 2013/0050070 | A1 | 2/2013 | Lewis et al. |
| 2013/0083403 | A1 | 4/2013 | Takagi et al. |
| 2013/0113973 | A1 | 5/2013 | Miao |
| 2013/0114039 | A1 | 5/2013 | Elazowski |
| 2013/0235331 | A1 | 9/2013 | Heinrich et al. |
| 2013/0250232 | A1 | 9/2013 | Belbey et al. |
| 2013/0314303 | A1 | 11/2013 | Osterhout et al. |
| 2015/0219919 | A1 | 8/2015 | Ouderkirk et al. |
| 2015/0234201 | A1 | 8/2015 | Levesque |

FOREIGN PATENT DOCUMENTS

| | | | | |
|---|---|---|---|---|
| CN | 101512632 A | 8/2009 | | |
| CN | 201307188 Y | 9/2009 | | |
| CN | 101963744 A | 2/2011 | | |
| CN | 202758142 U | 2/2013 | | |
| JP | 2003255360 A | * 10/2003 | ........... | G02F 1/1339 |
| TW | 463057 B | 11/2001 | | |
| TW | 201300834 A | 1/2013 | | |
| TW | 201415088 A | 4/2014 | | |
| WO | WO 9923525 A1 | 5/1999 | | |
| WO | WO 0055676 A1 | 9/2000 | | |
| WO | WO 2008008646 A2 | 1/2008 | | |

OTHER PUBLICATIONS

Baranski et al. (Jan. 1, 2014) "Wafer-Level Fabrication of Microcube-Typed Beam-Splitters by Saw-Dicing of Glass Substrate," IEEE Photonics Technology Letters. 26(1):100-103.
Chuang et al. (Dec. 23, 2012) "Application of the Inclined Exposure and Molding Process to Fabricate a Micro Beam Splitter With Nanometer Roughness," Microsyst Technology. 19:461-470.
Li et al. (May 1, 1996) "Visible Broadband, Wide-Angle, Thin-Film Multilayer Polarizing Beam Splitter," Applied Optics. 35(13):2221-2225.
Final Rejection corresponding to U.S. Appl. No. 14/278,474, dated Nov. 23, 2016, 23 pages.
Final Rejection corresponding to U.S. Appl. No. 14/278,407, dated Jan. 26, 2017, 13 pages.
Non-Final Rejection corresponding to U.S. Appl. No. 14/278,474, dated Aug. 1, 2016, 16 pages.
Non-Final Rejection corresponding to U.S. Appl. No. 14/278,452, dated Aug. 18, 2016, 10 pages.
Non-Final Rejection corresponding to U.S. Appl. No. 14/278,407, dated Jul. 21, 2016, 9 pages.
Non-Final Rejection corresponding to U.S. Appl. No. 14/278,407, dated Oct. 3, 2017, 12 pages.
Non-Final Rejection corresponding to U.S. Appl. No. 14/935,096, dated Mar. 27, 2017, 20 pages.
Non-Final Rejection corresponding to U.S. Appl. No. 14/278,438, dated Oct. 6, 2015, 8 pages.
Non-Final Rejection corresponding to U.S. appl. No. 14/278,474, dated Feb. 22, 2017, 15 pages.
Notice of Allowance corresponding to U.S. Appl. No. 14/278,474, dated Apr. 19, 2017, 9 pages.
Notice of Allowance corresponding to U.S. Appl. No. 14/935,096, dated Oct. 3, 2017, 9 pages.
Notice of Allowance corresponding to U.S. Appl. No. 14/278,438, dated Mar. 7, 2016, 10 pages.
Notice of Allowance corresponding to U.S. Appl. No. 14/278,452, dated Aug. 17, 2017, 10 pages.
Office Action corresponding to Chinese Patent Application No. 201410222332.4, dated Dec. 17, 2015, 5 pages.
Office Action corresponding to Chinese Patent Application No. 201410222138.6, dated Mar. 3, 2016, 12 pages.
Office Action corresponding to Chinese Patent Application No. 201410221982.7, dated Jan. 24, 2017, 11 pages.
Office Action corresponding to Chinese Patent Application No. 201410221982.7, dated Aug. 2, 2017, 11 pages.

(56) References Cited

OTHER PUBLICATIONS

Office Action corresponding to Chinese Patent Application No. 201410222138.6, dated Aug. 18, 2016, 12 pages.
Office Action corresponding to Chinese Patent Application No. 201410221982.7, dated May 5, 2016, 8 pages.
Office Action corresponding to Chinese Patent Application No. 201410221984.6, dated May 27, 2016, 3 pages.
Office Action corresponding to Chinese Patent Application No. 201410222138.3, dated May 18, 2017, 13 pages.
Office Action corresponding to Chinese Patent Application No. 201410222332.4, dated May 15, 2015, 8 pages.
Office Action corresponding to Chinese Patent Application No. 201410222138.6, dated Dec. 2, 2016, 23 pages.
Office Action corresponding to Taiwanese Patent Application No. 103117949, dated Apr. 1, 2015, 4 pages.
Office Action corresponding to Taiwanese Patent Application No. 103117947, dated Dec. 11, 2015, 3 pages.
Office Action corresponding to Taiwanese Patent Application No. 103117954, dated Jun. 27, 2016, 3 pages.
Office Action corresponding to Taiwanese Patent Application No. 103117947, dated Aug. 27, 2015, 10 pages.

* cited by examiner

WAFER-LEVEL LIQUID-CRYSTAL-ON-SILICON PROJECTION ASSEMBLY, SYSTEMS AND METHODS

RELATED APPLICATIONS

This application is a division of U.S. patent application Ser. No. 14/278,452 filed May 15, 2014, the entire content of which is incorporated herein by reference.

BACKGROUND

This invention relates to image projectors that employ liquid-crystal-on-silicon (LCOS) displays, and particularly, the assembly of optical components used in such image projectors.

LCOS image projectors based on LCOS displays, herein "LCOS projectors," have enabled consumer electronics products such as hand-held projectors and near-eye displays. The LCOS displays in LCOS projectors reflect light through a beamsplitter and a compound lens. Herein, the assembly containing of the LCOS display, beam splitter, and compound lens will be referred to as the projection assembly.

Precise alignment of the projection assembly components is required for LCOS image projectors to meet performance specifications. In prior-art LCOS image projectors, the projection assembly is assembled manually. Attempts to achieve the precise alignment tolerances with the manual assembly process results in a long assembly time and low yields.

SUMMARY

According to one embodiment, a wafer-level LCOS projection assembly is provided. The wafer-level LCOS projection assembly includes a LCOS display for spatially modulating light incident on the LCOS display and a polarizing beam-separating (PBS) layer for directing light to and from the LCOS display.

According to another embodiment, a method for fabricating a wafer-level LCOS projection system is provided. According to the method, a PBS wafer is disposed above an active-matrix wafer. The active-matrix wafer includes a plurality of active matrices for addressing liquid crystal display pixels. Also according to the method, a lens wafer is disposed above the PBS wafer. The lens wafer includes a plurality of lenses.

According to another embodiment, method for fabricating a wafer-level polarizing beam separator is provided. According to the method, a PBS wafer and at least one other wafer are bonded to form a stacked wafer. The PBS wafer includes a PBS layer that contains a plurality of PBS film bands.

DETAILED DESCRIPTION OF THE EMBODIMENTS

Figure 1:
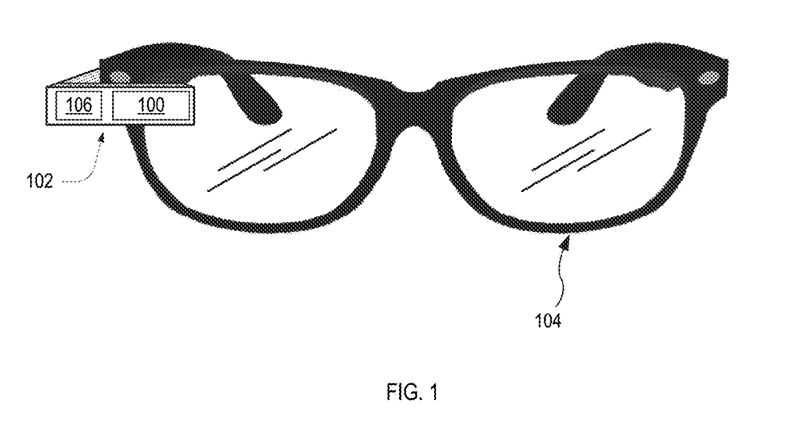
FIG. 1 shows a projection assembly incorporated into a near-eye display attached to a pair of eyeglasses.

FIG. 1 shows a projection assembly 100 incorporated into a near-eye display 102 attached to eyeglasses 104. Near-eye display 102 further includes a light source 106. Projection assembly 100 may alternately be employed in a different imaging device, such as in a hand-held image projector.

Figure 2:
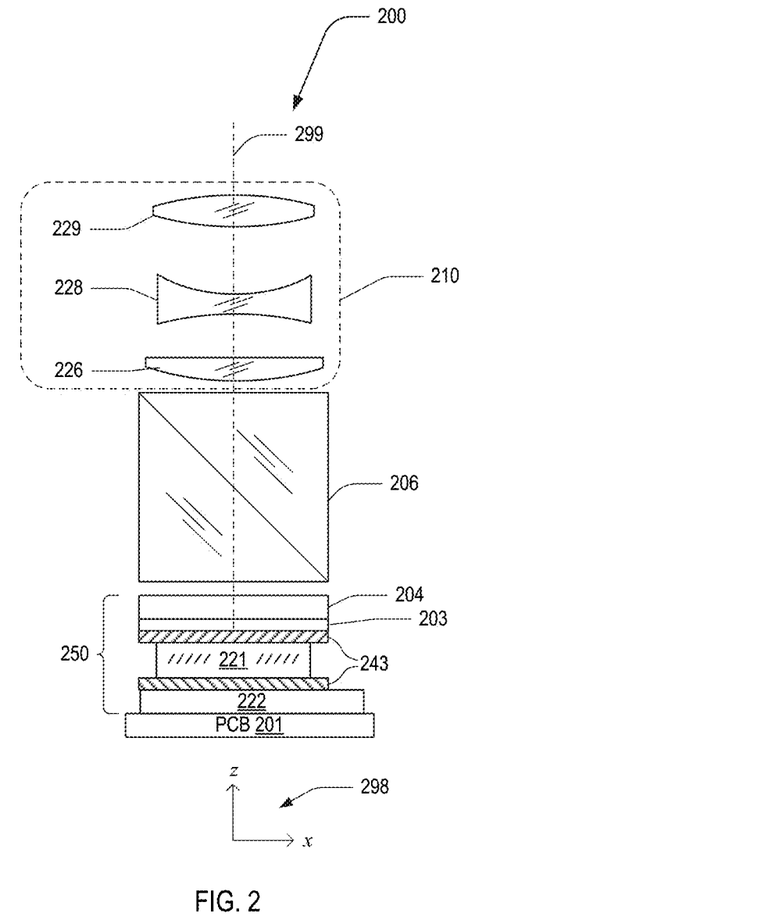
FIG. 2 shows optical components of a projection assembly, in an embodiment.

FIG. 2 shows optical components of a projection assembly 200, which is an example of projection assembly 100. Projection assembly 200 includes wafer-level LCOS die 250, polarizing beam splitter cube 206, and compound lens 210. Compound lens 210 includes lenses 226, 228, and 229. Wafer-level LCOS die 250 includes active-matrix substrate 222, alignment layers 243, liquid crystal 221, conducting film 203, and cover glass 204. Active-matrix substrate 222 is mounted on a printed circuit board (PCB) 201.

Wafer-level LCOS die 250 is an LCOS display. Polarizing beam splitter cube 206 is configured to reflect illumination light from a light source, not shown in FIG. 2, onto LCOS die 250 to illuminate the LCOS display. Light emitted by the LCOS display is at least partially transmitted by polarizing beam splitter cube 206 and projected by compound lens 210 to form an image of the LCOS display.

In projection assembly 200, all components are centered about an optical axis 299 within alignment tolerances of assembly methods. Transverse and longitudinal misalignment refers to misalignment along the x-axis and z-axis respectively, of coordinate system 298.

Figure 3:
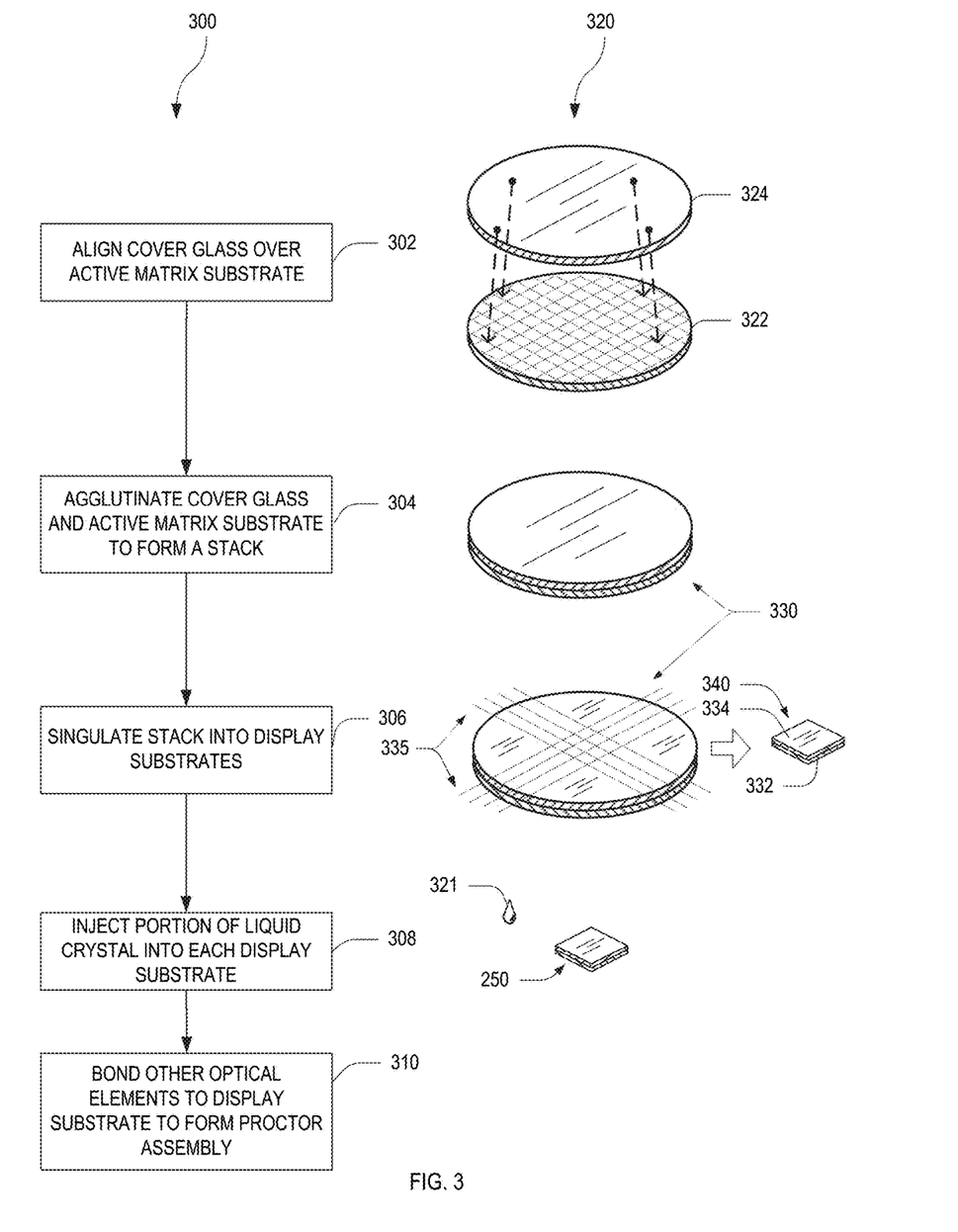
FIG. 3 depicts a method of fabricating projection assembly and an associated visual diagram.

FIG. 3 depicts a method 300 of fabricating projection assembly 200 and an associated visual diagram 320, in one embodiment. Visual diagram 320 is for exemplary purposes only and is not intended to be limiting in scope hereof. As an example, method 300 fabricates LCOS die 250, apart from injection of liquid crystal portion 321, at the wafer-level and bonds the remaining elements of projection assembly 200 to LCOS die 250 using non-wafer-level methods.

In step 302, method 300 aligns a cover glass over an active-matrix wafer. In one example of step 302, method 300 aligns cover glass 324 over active-matrix wafer 322.

In step 304, method 300 bonds a cover glass and the active-matrix wafer to form a stack. In one example of step 304, method 300 bonds cover glass 324 and active-matrix wafer 322 to form a stack 330. Cover glass 324 and active-matrix wafer 322 are examples of cover glass 204 and active matrix 222 of FIG. 2, respectively.

In step 306, method 300 singulates the stack along dicing lines, which yields display substrates. In one example of step 306, method 300 singulates stack 330 along dicing lines 335, which yields display substrates 340.

In step 308, method 300 injects a liquid crystal portion between the glass layer and the active-matrix layer of a display substrate to form a wafer-level LCOS die 250 of a projection assembly. In one example of step 308, method 300 injects a liquid crystal portion 321 between the glass layer 334 and the active-matrix layer 332 of display substrate 340 to form, for example, wafer-level LCOS die 250 of projection assembly 200, FIG. 2.

Method 300 may include the step of adding alignment layers to one or both active-matrix wafer 322 and cover glass 324 without departing from the scope hereof. In step 310, method 300 forms projection assembly 200 of FIG. 2 by bonding PCB 201, polarizing beam splitter cube 206, and lenses 226, 228, and 229 of projection assembly 200 (FIG. 2) to LCOS die 250.

Figure 4:
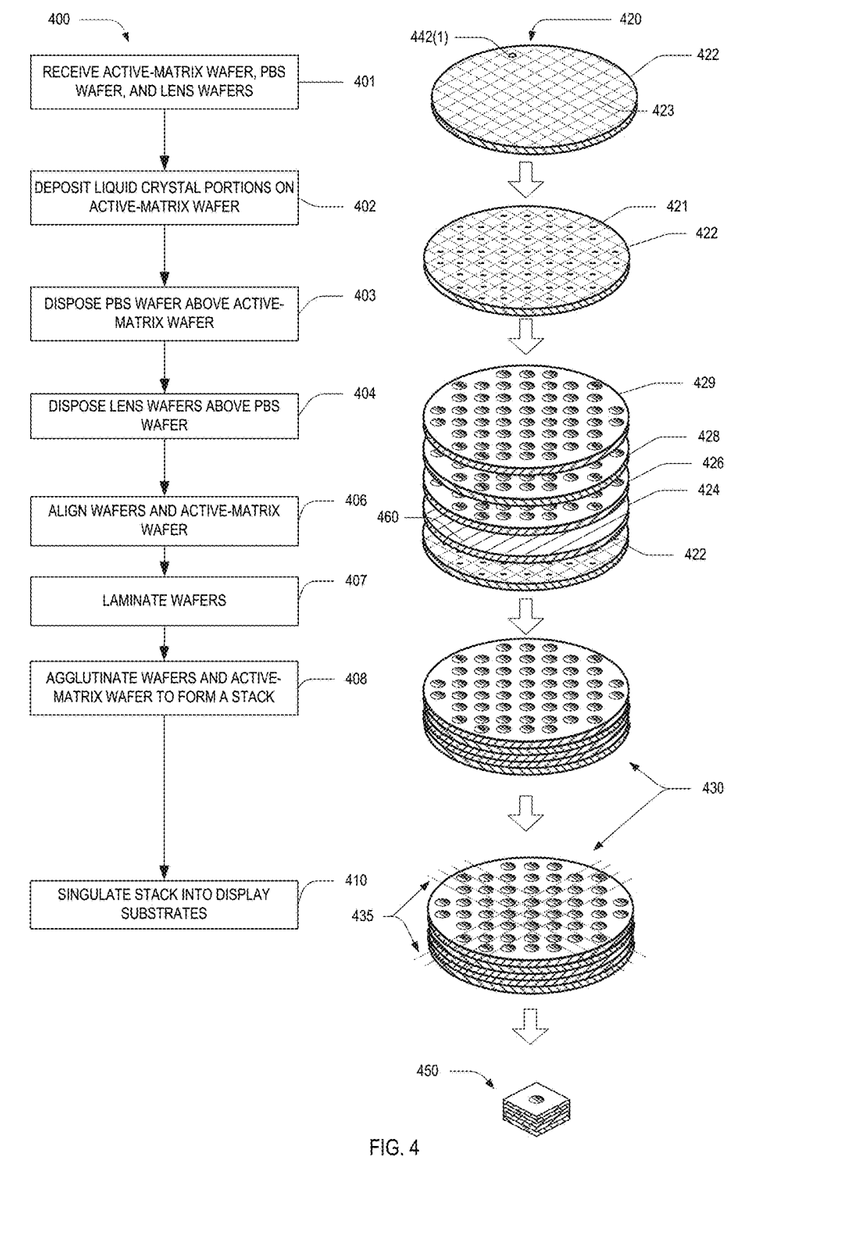
FIG. 4 depicts a method, and an associated visual diagram, of fabricating a projection assembly with multiple components fabricated at the wafer level, in an embodiment.

In projection assembly 200, only display substrate 340 is fabricated at the wafer level. FIG. 4 depicts a method 400 of fabricating a projection assembly with multiple components fabricated at the wafer level, and an associated visual diagram 420. Visual diagram 420 depicts active-matrix wafer 422, polarizing beam-separating (PBS) wafer 424, and lens wafers 426, 428, and 429. Lens wafers 426, 428, and 429 each include a lens array with identical array coordinates such that lens wafers 426, 428, and 429 may be stacked and aligned to form wafer-level compound lenses using methods known in the art. The number of lens wafers included in method 400 may differ from three without departing from the scope hereof.

In FIG. 4, the parallel lines shown on PBS wafer 424 denote PBS film bands 460 within PBS wafer 424. In an embodiment, the distance between PBS film bands equals the spacing between rows of lenses in lens wafers 426, 428, and 429, and rows of active matrices 442 in active-matrix wafer 422.

In an embodiment of PBS wafer 424, PBS film bands 460 may be multilayer thin-film polarizers known in the art, for example, a MacNeille polarizer. In another example, PBS film bands 460 may be based on the thin film multilayer structures described by Li and Dobrowolski, Appl. Opt. Vol. 35, p. 2221 (1996). Other embodiments of PBS wafer 424 may employ different polarization mechanisms, such as wire-grids, without departing from the scope hereof.

In an embodiment, PBS wafer 424 includes a transparent conducting film, indium titanium oxide (ITO) for example, deposited on the side of PBS wafer 424 facing active-matrix wafer 422. In an embodiment, PBS wafer 424 includes an alignment layer. In such an embodiment, PBS wafer 424 functions as both the beam-splitting component and a substrate for either or both the transparent conducting layer and the alignment layer needed to form an LCOS display of the projection assembly. This dual functionality of PBS wafer 424 eliminates the need for an additional cover glass layer above active matrix wafer 422, such as cover glass 204 in projection assembly 200 of FIG. 2. In an embodiment, PBS wafer 424 includes an anti-reflective (AR) coating and the transparent conducting film, and the PBS film is disposed therebetween.

In step 401, method 400 receives an active-matrix wafer, a PBS wafer 424, and lens wafers. In an example of step 401, method 400 receives active-matrix wafer 422, PBS wafer 424, and lens wafers 426, 428, and 429. The dotted-line grid on active-matrix wafer 422 represents dam structures 423. Active-matrix wafer 422 includes active matrices 442, such as active matrix 442(1), at locations between dam structures 423. For clarity of illustration, active matrix 442(1) is the only active matrix shown on active-matrix wafer 422. Active-matrix wafer 422 may include any of the following, as known in the art: a second alignment layer, a reflective layer, and an electrode.

In step 402, method 400 deposits liquid crystal portions at locations on the active-matrix wafer. In an example of step 402, method 400 deposits liquid crystal portions 421, denoted by dashes (-) at locations on active-matrix wafer 422. The deposition locations on active-matrix wafer 422 correspond to individual active matrices 442 in active-matrix wafer 422.

In an example of step 402, the liquid crystal deposition may be a one-drop fill (ODF) process where portions of liquid crystal are deposited on active-matrix wafer 422 at positions corresponding to active matrices 442. Other liquid crystal deposition methods may be employed in method 400 without departing from the scope hereof. Dam structures 423 contain each liquid crystal portion 421 to its respective position on active-matrix wafer 422.

In step 403, method 400 disposes the PBS wafer above the active-matrix wafer. In an example of step 403, method 400 disposes PBS wafer 424 above active-matrix wafer 422.

In step 404, method 400 disposes the lens wafers above the PBS wafer. In an example of step 404, method 400 disposes lens wafers 426, 428, and 429 above PBS wafer 424.

In step 406, method 400 aligns the PBS wafer and the lens wafers over the active-matrix wafer. In an example of step 406, method 400 aligns PBS wafer 424 and lens wafers 426, 428, and 429 over active-matrix wafer 422. PBS wafer 424 is aligned such that PBS film bands 460 are centered over respective rows of active matrices 442 within active-matrix wafer 422.

Wafers 422, 426, 428, and 429 are aligned such that, within alignment tolerances achievable in the art, for a plurality of lenses of lens wafer 429, each lens center is collinear with a lens center in lens wafer 428, a lens center in lens wafer 426, and the center of an active matrix on wafer 422. PBS wafer 424 is aligned such that, within alignment tolerances achievable in the art, PBS film bands 460 are aligned with rows of lenses in lens wafers 426, 428, and 429, and rows of active matrices 442 in active-matrix wafer 422. Step 406 may employ any alignment method known in the art of wafer-level optics fabrication.

In step 407, method 400 laminates the wafers as known in the art.

In step 408, method 400 bonds the active matrix wafer, PBS wafer, and lens wafers to form a wafer stack. In an example of step 408, method 400 bonds wafers 422, 424, 426, 428, and 429 to form a wafer stack 430.

In step 410, method 400 singulates the wafer stack along dicing lines, which results in a plurality of wafer-level LCOS projection assemblies. In an example of step 410, method 400 singulates wafer stack 430 along dicing lines 435, which results in a plurality of wafer-level LCOS projection assemblies 450.

Figure 5:
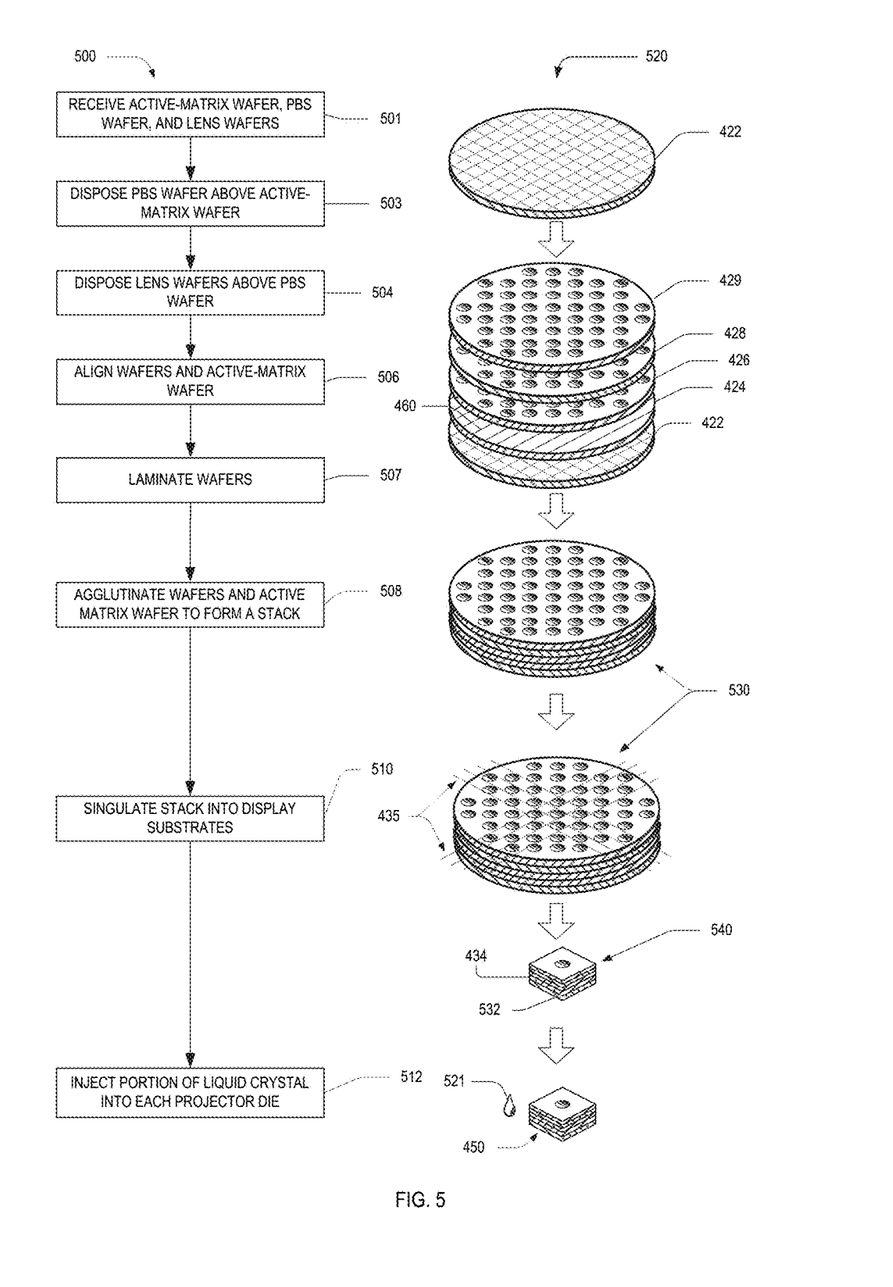
FIG. 5 depicts a variation of the method depicted in FIG. 4, in an embodiment.

FIG. 5 depicts method 500, which is similar to method 400 except that the liquid crystal is deposited after singulation step 410, rather than before. Steps 501, 503, 504, 506, 507, 508, and 510 of method 500 are identical to steps 401, 403, 404, 406, 407, 408, and 410 of method 400, respectively.

In step 508, method 500 bonds the active matrix wafer, PBS wafer, and lens wafers to form a wafer stack. In an example of bonding step 508, method 500 results in wafer stack 530. Wafer stack 530 is identical to wafer stack 430 except that the bottom layer, active-matrix wafer 422, does not include liquid crystal portions 421. Dam structures 423 support an air gap between active-matrix wafer 422 and PBS wafer 424 into which a liquid crystal volume may be deposited after dicing.

In step 510, method 500 singulates the wafer stack along dicing lines. Whereas in method 400, step 410 yields wafer-level LCOS projection assemblies, step 510 in method 500 yields a plurality of projector dies. In an example of step 510, method 500 singulates wafer stack 530 along dicing lines 435, which results in a plurality of projector dies 540. Projector dies 540 are identical to LCOS projection assemblies 450, except that the former lack liquid crystal portions 421.

In step 512, method 500 injects a liquid crystal portion in the air gap between a substrate layer and a thin-film layer of a projector die to form a wafer-level LCOS projection assembly. In an example of step 512, method 500 injects a liquid crystal portion 521 in the air gap between substrate layer 532 and thin-film layer 434 of projector die 540 to form a wafer-level LCOS projection assembly 450. In embodiments of method 500, the liquid-crystal injection step 512 may employ a method known in the art such as a vacuum-siphon method or a side-injection method.

Figure 6:
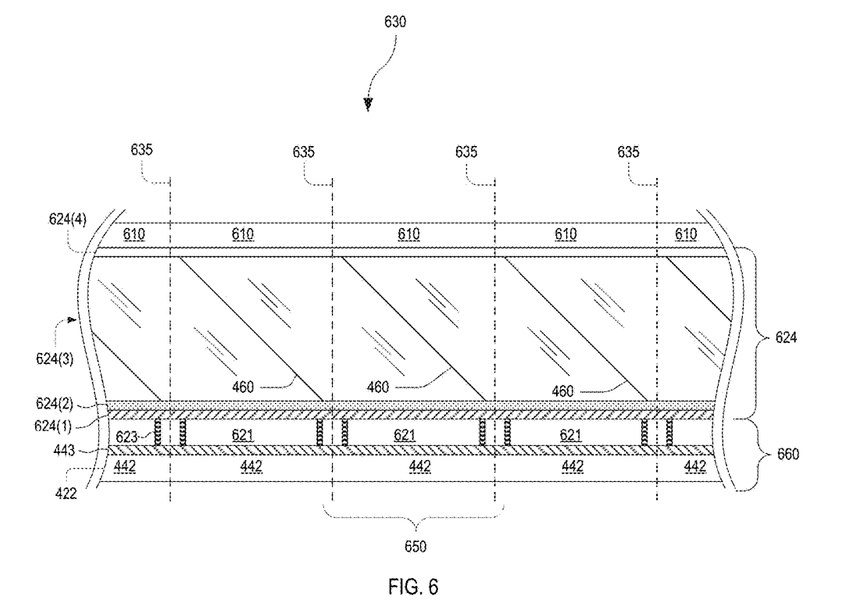
FIG. 6 is a cross-sectional view of wafer-level LCOS projection assemblies before singulation, in an embodiment.

FIG. 6 shows a wafer stack 630 in a cross-sectional view. Wafer stack 630 is an embodiment of wafer stack 430 of FIG. 4, and individual wafer-level LCOS projection assemblies 650 formed from singulation along singulation lines 635. Wafer stack 630 includes an LCOS layer 660, a PBS layer 624, and compound wafer-level lenses 610.

LCOS layer 660 includes active-matrix wafer 422, bottom alignment layer 443, and liquid crystal portions 621. Dam structures 623 contain liquid crystal portions 621. In the embodiment of wafer stack 430 shown in FIG. 6, bottom alignment layer 443 is deposited on active-matrix wafer 422. Active matrices 442 (FIG. 4) are within active-matrix wafer 422.

PBS layer 624 corresponds to PBS wafer 424 of FIG. 4. PBS layer 624 includes optional AR coating layer 624(4), PBS layer 624(3), transparent conducting layer 624(2), and top alignment layer 624(1). PBS layer 624(3) includes a PBS film band 460 (FIG. 4) between each pair of singulation lines 635. Liquid crystal portions 621 are between top alignment layer 624(1) and bottom alignment layer 443. In an embodiment, PBS film bands 460 are oriented at substantially 45 degrees to the plane of LCOS layer 660.

Without departing from the scope hereof, liquid crystal portions 621 may be omitted from wafer stack 630, such that wafer stack 630 is an embodiment of wafer stack 530 of FIG. 5. Liquid crystal portions 621 may be added after singulation along singulation lines 635, according to step 512 of method 500 (FIG. 5) to form individual wafer-level projection assemblies 650 that include liquid crystal portions 621. Thus, wafer-level LCOS projection assemblies 650 may be fabricated using method 400 (FIG. 4) or method 500 (FIG. 5).

Figure 7:
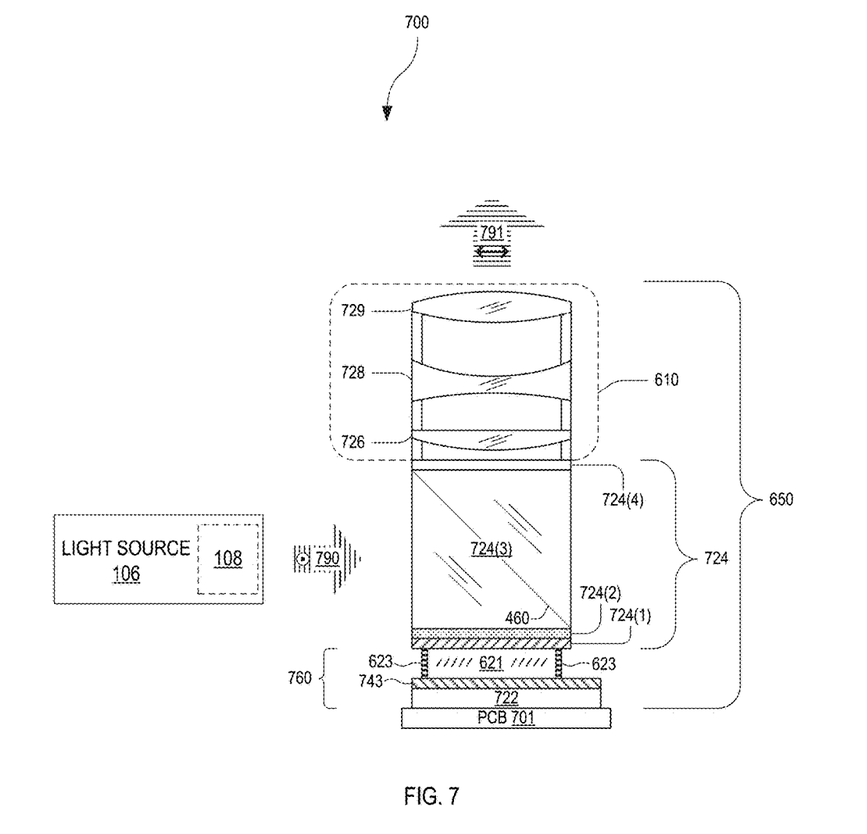
FIG. 7 is a cross-sectional view of a singulated wafer-level LCOS projection assembly mounted on printed circuit board, in an embodiment.

FIG. 7 shows an exemplary wafer-level LCOS projector system 700. Projector system 700 includes a wafer-level projection assembly 650 (FIG. 6). Wafer-level LCOS projection assembly 650 is an embodiment of wafer-level LCOS projection assembly 450.

Wafer-level LCOS projection assembly 650 includes an LCOS section 760, a PBS section 724, and compound wafer-level lens 610. LCOS section 760 includes an active-matrix wafer 722, which includes an active-matrix 442 (FIG. 4) and a reflective film. Active-matrix wafer 722 supports liquid crystal portion 621 (FIG. 6) between a top alignment layer 724(1) and a bottom alignment layer 743. Top alignment layer 724(1) and bottom alignment layer 743 are portions of top alignment layer 624(1) and 643, respectively of FIG. 6, formed by singulation along singulation lines 635 (FIG. 6). Dam structure 623 (FIG. 6) contains liquid crystal portion 621 (FIG. 6).

PBS section 724, formed from PBS wafer 424, includes top alignment layer 724(1), a transparent conducting film 724(2), a PBS element 724(3) and an AR coating 724(4). Transparent conducting film 724(2), PBS element 724(3), and AR coating 724(4) are portions of transparent conducting layer 624(2), PBS layer 624(3), and AR coating layer 624(4), respectively, of FIG. 6, where the portions are formed by singulation along singulation lines 635 (FIG. 6). Compound wafer-level lens 610 includes wafer-level lenses 726, 728, and 729. Wafer-level lenses 726, 728, and 729 are formed from lens wafers 426, 428, and 429 respectively. Wafer-level LCOS projection assembly 750 is mounted on a PCB 701.

In FIG. 7, wafer-level LCOS projection assembly 700 is illuminated by a light source 106. Light source 106 may include optional collimating optics 108. Light source 106 may be any light source known in the art. For example, light source 106 may include one or more light-emitting diodes (LEDs), wherein the LEDs emit light identical, overlapping, or mutually exclusive wavelength ranges.

In an embodiment of light source 106 and wafer-level LCOS projection assembly 750, light source 106 emits s-polarized input illumination 790 that is incident on PBS element 724(3). In FIG. 7, s-polarization and p-polarization refer to electric field components normal to the figure plane, and parallel to the figure plane, respectively. Input illumination 790 is the s-polarized component of the total illumination emitted by light source 106, which may also include p-polarized components.

PBS film band 460 of PBS element 724(3) reflects input illumination 790 through liquid crystal portion 621, which spatially modulates illumination 790. Active-matrix wafer 722 reflects at least a portion of input illumination 790 back through liquid crystal portion 621. Individual pixels of active-matrix wafer 722 may be set to change the polarization state of light propagating through associated sub-portions of liquid crystal portion 621. In a lit state of a pixel, the double-pass through liquid crystal portion 721 rotates the polarization state of illumination 790 to form emitted light that at least includes a p-polarization state. The p-polarized component of the emitted light is transmitted through PBS element 724(3) and is projected by compound wafer-level lens 710 as output illumination 791.

Wafer-level LCOS projection assembly 650 is superior to projection assembly 200, FIG. 2, in at least two aspects: alignment and size. Because the optical components in wafer-level LCOS projection assembly 450 are aligned at the wafer level, they are less prone to transverse misalignment than those in projection assembly 200, in which optical components are manually aligned. Wafer-level LCOS projection assembly 450 is also more space-efficient than projection assembly 200, as only the latter requires a cover glass 204 between polarizing beam splitter cube 206 and active-matrix substrate 222.

Figure 8:
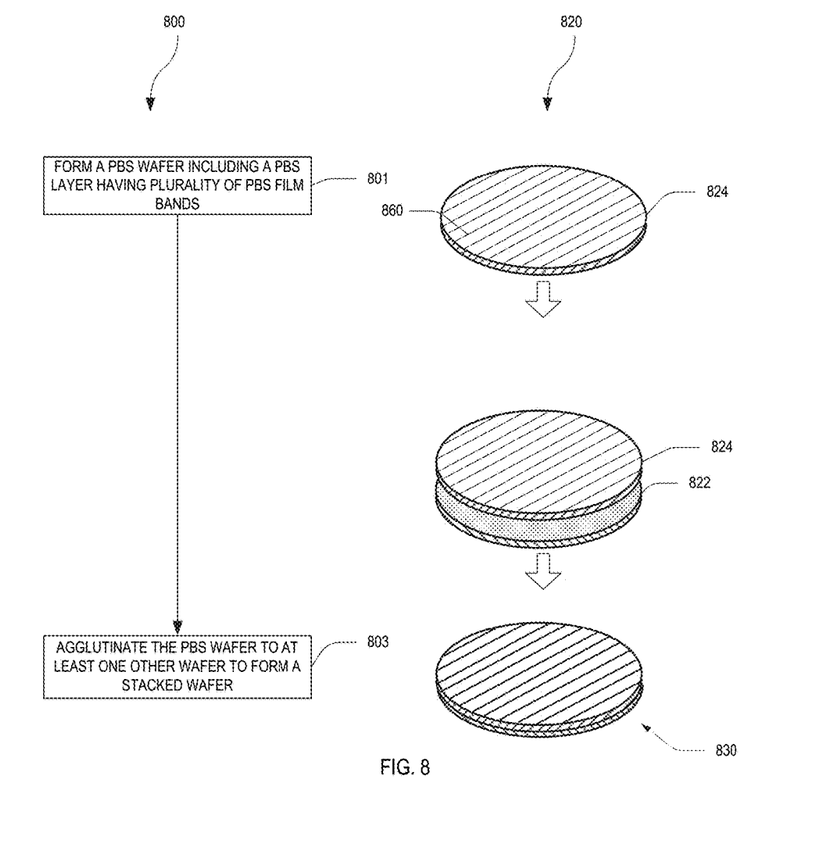
FIG. 8 depicts a method, and an associated visual diagram, for fabricating a wafer-level polarizing beam separator, in an embodiment.

FIG. 8 depicts a wafer-level method 800, and an associated visual diagram 820, for fabricating a plurality of optical systems that include a polarizing beam separator. In step 801, method 800 forms a PBS wafer including PBS layer having a plurality of PBS bands. In an example of step 801, method 800 forms PBS wafer 824 including PBS layer having a plurality of PBS bands 860.

In an embodiment, PBS wafer 824 includes a substrate and the PBS layer is disposed thereupon. The substrate may function as an alignment layer for an LCOS assembly as discussed in connection with FIGS. 4-7.

In step 802, method 800 bonds the PBS wafer to a wafer to form a stacked wafer. In an example of step 802, method 800 bonds PBS wafer 824 to wafer 822 to form a stacked wafer 830.

In an embodiment, wafer 822 is a LCOS wafer, such as active-matrix wafer 422 of FIG. 4. In another embodiment, wafer 822 is a lens wafer, such as lens wafer 424 of FIG. 4.

In an optional singulation step, method 800 singulates the stacked wafer to form a plurality of optical systems that include a polarizing beam separator. In an example of optional singulation step, method 800 singulates stacked wafer 830.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for fabricating a wafer-level liquid crystal on silicon (LCOS) projection systems, comprising:
    disposing a polarizing beam-separating (PBS) wafer above an active-matrix wafer that includes an arrayed plurality of active matrices for addressing liquid crystal display pixels, the PBS wafer including a plurality of PBS film bands each (i) oriented at 45 degrees to a plane of the active-matrix wafer and (ii) configured to reflect an input illumination toward the active-matrix wafer, a distance between adjacent PBS film bands, of the plurality of PBS film bands, equaling a spacing between rows of the arrayed plurality of active matrices; and
    disposing a lens wafer, including a plurality of lenses, above the PBS wafer.

2. The method of claim 1, further comprising:
    aligning the lens wafer, the PBS wafer, and the active-matrix wafer; and
    bonding the lens wafer, PBS wafer, and active-matrix wafer to form a stacked wafer.

3. The method of claim 2, the step of aligning comprising aligning the plurality of lenses with a respective one of the plurality of PBS film bands.

4. The method of claim 3, the step of aligning further comprising aligning the plurality of PBS film bands with a respective plurality of active matrices of the active-matrix wafer.

5. The method of claim 2, further comprising:
    singulating the stacked wafer to form a plurality of optical modules; and
    injecting a portion of liquid crystal between the active-matrix wafer and the PBS wafer for at least a portion of the plurality of optical modules.

6. The method of claim 1, further comprising:
    singulating a stacked wafer, including the PBS wafer, the active matrix substrate, and the lens wafer, to form a plurality of LCOS projection systems.

7. The method of claim 1, further comprising:
    injecting liquid crystal between at least a portion of the PBS wafer and at least a portion of the active-matrix wafer to form a LCOS display.

8. The method of claim 1, further comprising, preceding the step of disposing the PBS wafer:
    disposing a plurality of liquid crystal portions on the active-matrix wafer at locations corresponding to each of the plurality of active matrices.

* * * * *